United States Patent [19]

Serino

[11] 4,254,301
[45] Mar. 3, 1981

[54] PRINTED CIRCUIT BOARD COMPONENT MOUNTING SUPPORT AND SPACER

[75] Inventor: Louis J. Serino, Calabasas, Calif.

[73] Assignee: Xerox Corporation, Stamford, Conn.

[21] Appl. No.: 21,749

[22] Filed: Mar. 19, 1979

[51] Int. Cl.³ .......................................... H01B 17/14
[52] U.S. Cl. .............................. 174/138 G; 361/403; 361/418
[58] Field of Search .............................. 361/403, 418; 174/138 G

[56] References Cited

U.S. PATENT DOCUMENTS

| D. 200,157 | 1/1965 | Vincent | 174/138 G |
|---|---|---|---|
| 3,122,679 | 2/1964 | Kislan | 361/418 |
| 3,163,393 | 12/1964 | Strong | 361/418 |
| 3,377,514 | 4/1968 | Ruehlemann | 361/403 |
| 3,714,514 | 1/1973 | Vesterling | 361/403 |
| 3,962,719 | 6/1976 | Pfaff | 357/74 |
| 4,039,236 | 8/1977 | Schelper | 361/418 X |

FOREIGN PATENT DOCUMENTS 1372872 10/1963 France .................................. 174/138 G

OTHER PUBLICATIONS

N. G. Jones, Transistor Spacer, IBM Tech. Bull., v. 8, #9, Feb. 1966.

Primary Examiner—Richard R. Kucia
Attorney, Agent, or Firm—Franklyn C. Weiss

[57] ABSTRACT

A printed circuit board component mounting support and spacer having a base 20 with a square face 42, 44, 46, 48 and at least four rectangular feet 32, 34, 36, 38 extending out from the square planar surface of base 20. Extending upwards from base 20 are four projections 10, 12, 14, 16 to cradle an electrical component 8. The base 20 has a hole 60 through which the component leads are inserted before inserting the component leads through the appropriate holes in the board. Between each pair of fingers 10, 12 and 14, 16 adjacent the extremities of hole 60 are upwardly projecting nibs 52, 54, 56, 58 to contact the bottom of the component to provide a cooling space and pivot point for minimal transverse movement.

5 Claims, 5 Drawing Figures

PRINTED CIRCUIT BOARD COMPONENT MOUNTING SUPPORT AND SPACER

The invention relates to a printed circuit board component mounting support and spacer; a support or spacer is utilized as a mounting device for mounting and supporting circuit components to a printed circuit board.

BACKGROUND OF THE INVENTION

Certain components, when wired to a printed circuit board, provide their own mechanical stability upon mounting and soldering. For example, when a standard resistor is mounted to a printed circuit board, the leads of the resistor are inserted through holes which are spaced apart from each other a distance slightly greater than the length of the resistor. The leads are pulled through the back of the printed circuit board until the length of the resistor itself rests against the board. The excess lead length is snipped off and then the resistor is soldered to the board.

Other components, however, are not mounted horizontally or lengthwise along the board, but are mounted in a more or less vertical direction such as disc capacitors. In this situation, the connection electrical leads emanate from the bottom or short dimension of the device and would be mounted similarly to the resistor as set forth above. However, the vertical configuration of the part does not make for a stable mount to a board. If the board is not mishandled until the board becomes more or less permanently mounted in the final equipment, no physical damage, of course, will occur to the electrical part. However, a printed circuit board goes through many mechanical and human procedures before coming to rest in a piece of equipment. That is, the board has to be stuffed with all the components, then it has to be soldered, then it has to be mechanically and electrically tested, stored, shipped, and finally installed. In all these operations, the possibility of an inadvertent lateral force being applied to the vertically mounted piece becomes great. Such a lateral force could cause breakage of the component, pull the leads out of the solder connection, cause a short circuit with the adjacent component, and so on.

Mounting brackets are known in the prior art for mounting components to printed circuit boards. Most of these brackets or mounting devices must themselves, however, be mounted to the board. Such items could include vacuum tube sockets, transistor sockets, dual in line package sockets as for integrated circuits, and so on.

According to the present invention, a mounting support or spacer is disclosed. The advantages of the invention are mainly that the support or spacer is inexpensive to make, is made out of inexpensive plastic, and does not have to be itself mounted to a printed circuit board. Further, the device provides lateral support for the electrical component for which it is designed, provides vertical spacing from the printed circuit board to prevent shorts and allow sufficient air circulation, and provides lateral spacing between similar or dissimilar circuit components on the board.

DESCRIPTION OF THE DRAWINGS

For a more complete understanding of the invention, reference may be had to the following detailed description of the invention in conjunction with the drawings wherein.

SUMMARY OF THE INVENTION

Figure 1:
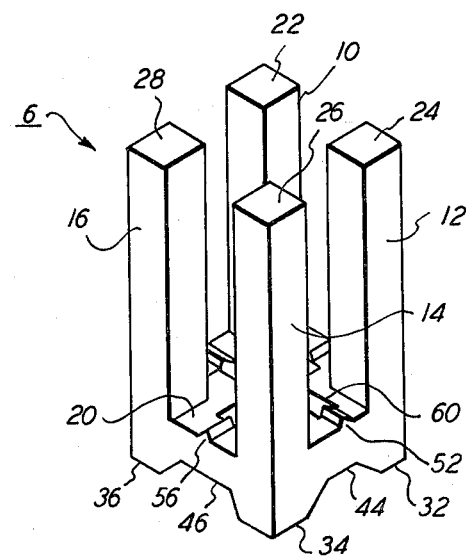
FIG. 1 is a perspective view of the support/spacer in accordance with the invention.
Figure 2:
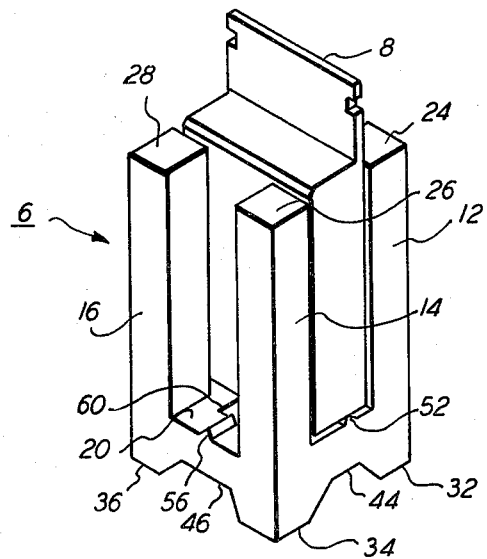
FIG. 2 is a perspective view of the support/spacer in accordance with the invention as set forth in FIG. 1 but with a circuit component shown in operating relationship with the support/spacer.
Figure 3A:
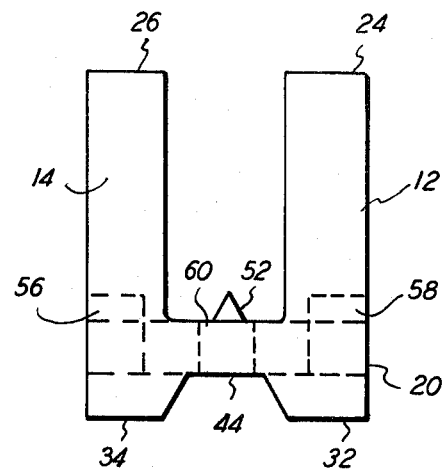
FIGS. 3A, 3B, and 3C are front, side, and bottom views, respectively, of the support/spacer in accordance with the present invention.
Figure 3B:
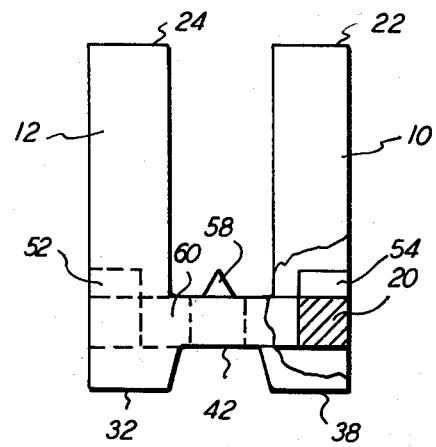
Figure 3C:
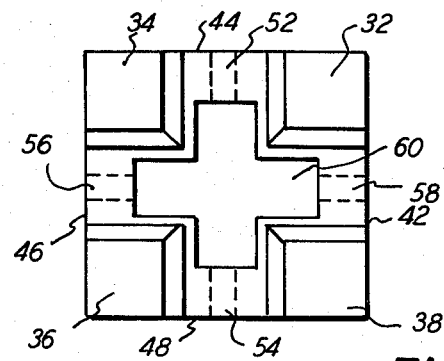

In accordance with the invention, a component mounting support and spacer is disclosed having a base 20 with a square face 42, 44, 46, 48 and at least four essentially rectangular feet 32, 34, 36, 38 extending out from said base 20. Extending upward from said base 20 are four projecting fingers 10, 12, 14, 16 to cradle an electrical component 8. The base 20 has a hole 60 in it through which the electrical leads of the component 8 are inserted before inserting the component leads through the appropriate holes in the board. Between opposite pairs of the support/spacer fingers are upwardly projecting nibs or projections 52, 54, 56, 58 to contact the bottom of component 8.

DETAILED DESCRIPTION OF THE INVENTION

The figures show a support/spacer for positioning components on a printed circuit board. The figures include similar reference numbers when appropriate and will be discussed in reference to the invention all at once.

The support/spacer 6, as shown in the figures, presents essentially a square face 42, 44, 46, 48 to the board (not shown). However, this square face does not contact the board as there are at least four rectangular feet 32, 34, 36, 38 extending out from the square planar surface of base 20. These feet end in a planar surface parallel to the surface from which the feet begin. This second planar surface allows the support/spacer to sit flat and stable on the board itself. The feet 32, 34, 36, 38 are shown to be inclined inwards towards the plane 42, 44, 46, 48. This allows more room for the component leads, but the feet could just as well have been vertically extended from the base 20.

The feet extend upwards from the base 20 to form four upwardly directed projections 10, 12, 14, 16 which define another plane 22, 24, 26, 28 parallel to plane 42, 44, 46, 48 and plane 32, 34, 36, 38. It is these projections which would cradle the electrical component to be protected. In the figures shown the upward finger projections are about five times the length of the downward extended feet.

In the solid square base 20 of the clip is a cutout hole 60. This hole provides the opening through which an electrical component 8 is inserted before inserting the component leads in the proper holes in the printed circuit board.

The process would be as follows. The operator would take the electrical component 8 in one hand, pick up a support 6 of the present invention in the other hand and place the leads of the component through the hole 60 in the square faced base and properly position the component 8 between the upwardly projected fingers 10, 12, 14, 16 of the support 6. Then, with the component in the support the leads of the component would be inserted in the holes in the board, insuring that all four feet 32, 34, 36, 38 of the support are in contact with the board to provide rigid, stable support for the component 8. Then, the leads can be clipped and soldered to the board in the well known prior art manners. Of course, the above process can be mechanically automated for assembly line production.

Between each pair of fingers 10, 12 and 14, 16 adjacent to the extremity of the hole 60 in the base of the support could be an upwardly projected nib or teat 52, 54, 56 and 58 respectively. Two of these four nibs 52, 54, 56 and 58 would contact the bottom surface of the component and provide an exact amount of space for air movement for cooling and to provide a pivot point to allow for slight transverse or lateral movement. In the event there is an inadvertent lateral force, the part 8 can move slightly without pulling the leads out of the board. This device and its features are designed in a symmetrical fashion such that the component 8 can be installed in any one of four orientations for ease of assembly.

If the part to be protected is a TO-220 size triac, for example, the overall height of support/spacer 6 would be approximately 14 mm, 11 mm on each side, each upward finger 10, 12, 14, 16 and downward foot 32, 34, 36, 38 3 mm square while the hole 60 would be 2 by 7 mm. The feet 32, 34, 36, 38 would extend downward approximately 2 mm. The nibs 52, 54, 56 and 58 would extend up from the base 20 about 1 mm; while the base 20 itself is about 2 mm thick. Of course, for a different component other than a TO220 size part, the dimensions would change accordingly without departing from the spirit and scope of the invention.

While the invention has been described with reference to specific embodiments, it will be understood by those skilled in the art that various changes may be made and equivalents may be substituted for elements thereof without departing from true spirit and scope of the invention. In addition, many modifications may be made without departing from the essential teachings of the invention.

What is claimed is:

1. A printed circuit board component mounting support and spacer having a base 20 with a square face 42, 44, 46, 48 and at least four essentially rectangular feet 32, 34, 36, 38 extending out from said base 20 characterized in that extending upwards from said base 20 are four projecting fingers 10, 12, 14, 16 to cradle an electrical component 8, between each pair of said upwardly extended fingers 10, 12, 14, 16 are upwardly projecting nibs or projections 52, 54, 56, 58 to contact the bottom of a component 8, and wherein said base 20 has a hole 60 through which the electrical leads of a component 8 are inserted before inserting the component leads through the appropriate holes in the board.

2. A component mounting support and spacer as set forth in claim 1 in which said hole 60 is of a cross configuration with the extremities of said hole 60 being adjacent to nibs or projections 52, 54, 56, 58.

3. A component mounting support and spacer as set forth in claim 2 in which the upwardly projecting fingers 10, 12, 14, 16 are about five times the length of the feet 32, 34, 36, 38.

4. A component mounting support and spacer as set forth in claim 3 in which the plane of the feet 32, 34, 36, 38, the plane of the base 42, 44, 46, 48, and the plane 22, 24, 26, 28 of fingers 10, 12, 14, 16 are parallel to each other.

5. A printed circuit board component mounting support and spacer having a base 20 with a square face 42, 44, 46, 48 and at least four essentially rectangular feet 32, 34, 36, 38 extending out from said base 20 characterized in that extending upwards from said base 20 are four projecting fingers 10, 12, 14, 16 to cradle an electrical component 8, between at least two opposite pairs of said upwardly extending fingers 10, 12, 14, 16 are upwardly projecting nibs or projections 52, 54 to contact the bottom of a component 8, and wherein said base 20 has a hole 60 through which the electrical leads of a component 8 are inserted before inserting the component leads through the appropriate holes in the board.

* * * * *